(12) United States Patent
Kurahashi et al.

(10) Patent No.: US 8,912,099 B2
(45) Date of Patent: Dec. 16, 2014

(54) METHOD OF MANUFACTURING SEMICONDUCTOR DEVICE

(71) Applicant: Mitsubishi Electric Corporation, Tokyo (JP)

(72) Inventors: Kenichiro Kurahashi, Tokyo (JP); Yoshitaka Kamo, Tokyo (JP); Yoshitsugu Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/953,857

(22) Filed: Jul. 30, 2013

(65) Prior Publication Data

US 2014/0134835 A1 May 15, 2014

(30) Foreign Application Priority Data

Nov. 13, 2012 (JP) .................. 2012-249414

(51) Int. Cl.
*H01L 21/302* (2006.01)
*H01L 21/461* (2006.01)
*H01L 21/28* (2006.01)
*H01L 29/66* (2006.01)
*H01L 29/778* (2006.01)

(52) U.S. Cl.
CPC .... *H01L 21/28017* (2013.01); *H01L 29/66431* (2013.01); *H01L 29/778* (2013.01)
USPC .... 438/756; 438/757; 257/194; 257/E21.403; 257/E21.407

(58) Field of Classification Search
CPC ................... H01L 29/778; H01L 29/66431
USPC ............... 438/756, 757; 257/194, E21.403, 257/E21.407

See application file for complete search history.

(56) References Cited

U.S. PATENT DOCUMENTS

| | | | | |
|---|---|---|---|---|
| 4,670,090 | A * | 6/1987 | Sheng et al. | 438/571 |
| 5,734,185 | A * | 3/1998 | Iguchi et al. | 257/336 |
| 6,451,639 | B1 * | 9/2002 | Jang et al. | 438/183 |
| 6,774,000 | B2 * | 8/2004 | Natzle et al. | 438/300 |
| 6,844,238 | B2 * | 1/2005 | Yeo et al. | 438/424 |
| 7,422,971 | B2 * | 9/2008 | Murthy et al. | 438/595 |
| 7,648,867 | B2 * | 1/2010 | Watanabe et al. | 438/183 |
| 7,718,500 | B2 * | 5/2010 | Chong et al. | 438/300 |
| 8,557,645 | B2 * | 10/2013 | Kurahashi et al. | 438/182 |
| 2001/0026985 | A1 * | 10/2001 | Kim et al. | 438/312 |
| 2009/0032880 | A1 * | 2/2009 | Kawaguchi et al. | 257/369 |
| 2010/0059737 | A1 * | 3/2010 | Bhuwalka et al. | 257/28 |

FOREIGN PATENT DOCUMENTS

| | | |
|---|---|---|
| JP | 2-12838 A | 1/1990 |
| JP | 2-220449 A | 9/1990 |
| JP | 7-58060 A | 3/1995 |

\* cited by examiner

*Primary Examiner* — Olik Chaudhuri
*Assistant Examiner* — Nicholas Tobergte
(74) *Attorney, Agent, or Firm* — Leydig, Voit & Mayer, Ltd.

(57) ABSTRACT

A method of manufacturing a semiconductor device includes forming a first layer on a semiconductor layer, forming a second layer on the first layer, forming a patterned mask on the second layer, etching and removing a portion of the second layer that is not covered by the patterned mask, wet etching the first layer to a width which is less than the width of the patterned mask, after the wet etching, forming an insulating layer on the semiconductor layer, removing the first layer and the second layer to form an opening in the insulating layer, and forming a gate electrode on a surface of the semiconductor layer exposed through the opening.

5 Claims, 6 Drawing Sheets

METHOD OF MANUFACTURING SEMICONDUCTOR DEVICE

BACKGROUND OF THE INVENTION

1. Field of the Invention

The present invention relates to a method of manufacturing semiconductor devices such as, e.g., hetero-FETs (HFETs) and high electron mobility transistors (HEMTs) operating at high frequencies.

2. Background Art

Japanese Laid-Open Patent Publication No. H02-012838 discloses a technique in which an opening is formed in an $SiO_2$ layer on a substrate and then a gate electrode is formed on the area of the substrate exposed by the opening. This opening in the $SiO_2$ layer is formed using a patterned resist having a pattern which defines the opening. As a result, the gate electrode is formed to have a width which is equal to the width of the resist pattern.

It is desirable that a process for forming a gate electrode on a semiconductor layer can reduce the gate length while reducing damage to the surface of the semiconductor layer. A reduction in the gate length requires a reduction in the width of the gate electrode. In order to reduce the width of the gate electrode, dry etching is typically used to form the insulating layer pattern for forming the gate electrode.

It has been found, however, that the plasma associated with the dry etching causes damage to the surface of the semiconductor layer. In order to avoid this, wet etching may be used to form the insulating layer pattern for forming the gate electrode. However, it is difficult to form fine features by wet etching, although damage to the surface of the semiconductor layer can be reduced.

Since the technique disclosed in the above publication forms a gate electrode having a width equal to the width of the resist pattern, a high performance exposure apparatus is required to reduce the width of the gate electrode.

SUMMARY OF THE INVENTION

The present invention has been made to solve the above problems. It is, therefore, an object of the present invention to provide a method of manufacturing a semiconductor device, capable of reducing the width of an electrode of the semiconductor device while reducing damage to the surface of the semiconductor layer by using a simple method.

The features and advantages of the present invention may be summarized as follows.

According to one aspect of the present invention, a method of manufacturing a semiconductor device, includes a step of forming a first layer on a semiconductor layer of a substrate, a step of forming a second layer on the first layer, a step of forming a patterned mask on the second layer, a step of etching a portion of the second layer that are not covered by the patterned mask, a wet etching step of etching the first layer to a width which is less than the width of the patterned mask, a step of, after the wet etching step, forming an insulating layer on the semiconductor layer, a step of removing the first layer and the second layer to form an opening in the insulating layer, and a step of forming a gate electrode on a surface of the semiconductor layer exposed through the opening. In the wet etching step, the etch rate of the first layer is higher than that of the second layer.

According to another aspect of the present invention, a method of manufacturing a semiconductor device, includes a step of forming a Si oxide on a semiconductor layer of a substrate, a step of forming a patterned mask on the Si oxide, a step of applying an ashing treatment to a portion of the Si oxide exposed through the patterned mask to form an oxygen-rich portion in the Si oxide in such a way that a bottom portion of the Si oxide is not oxidized, a step of, after forming the oxygen-rich portion, removing the patterned mask, a wet etching step of etching a portion of the Si oxide without etching the oxygen-rich portion until a remaining portion of the Si oxide under the oxygen-rich portion has been reduced in width smaller than the width of the oxygen-rich portion, a step of, after the wet etching step, forming an insulating layer on the semiconductor layer, a step of removing the Si oxide and the oxygen-rich portion to form an opening in the insulating layer, and a step of forming a gate electrode on the semiconductor layer exposed through the opening.

Other and further objects, features and advantages of the invention will appear more fully from the following description.

DETAILED DESCRIPTION OF THE PREFERRED EMBODIMENTS

Methods of manufacturing a semiconductor device in accordance with embodiments of the present invention will be described with reference to the accompanying drawings. Throughout the specification the same or corresponding components are designated by the same reference symbols and may be described only once.

First Embodiment

Figure 1:
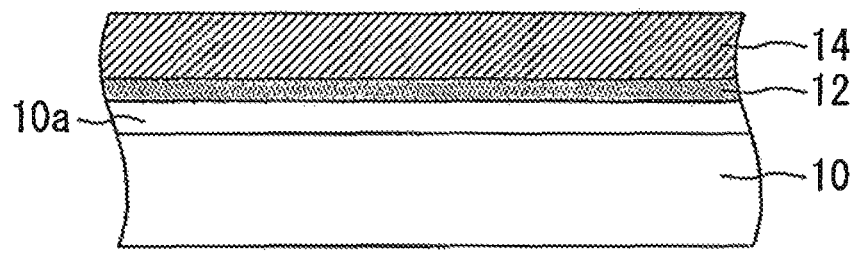
FIG. 1 is a cross-sectional view showing a first layer and a second layer of insulating film formed on a substrate.

A method of manufacturing a semiconductor device in accordance with a first embodiment of the present invention will be described with reference to the accompanying drawings. The method begins by forming insulating films on a semiconductor layer. FIG. 1 is a cross-sectional view showing a first layer 12 and a second layer 14 of insulating film formed on a substrate 10. The substrate 10 is formed of, e.g., SiC, and has a semiconductor layer 10a of, e.g., GaN or AlGaN epitaxially grown on its top surface. The first layer 12 is formed of SiO disposed on the semiconductor layer 10a. The second layer 14 is formed of SiN disposed on the first layer 12.

Figure 2:
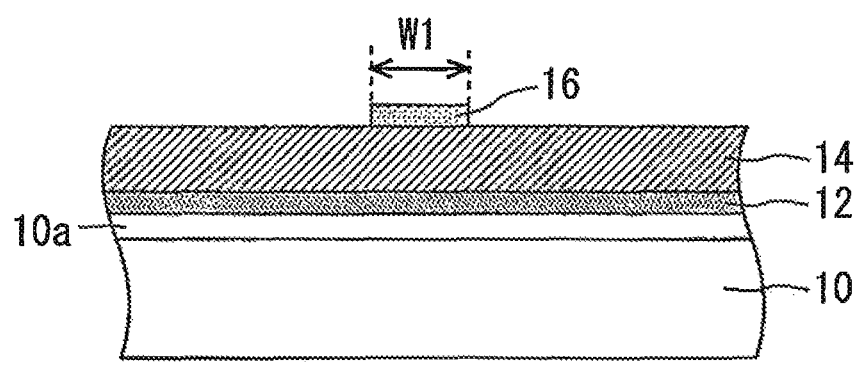
FIG. 2 is a cross-sectional view showing the mask.

Next, a patterned mask 16 is formed on the second layer 14. FIG. 2 is a cross-sectional view showing the mask 16 after it has been formed. This mask 16 is a resist mask or metal mask and has a width W1.

Figure 3:
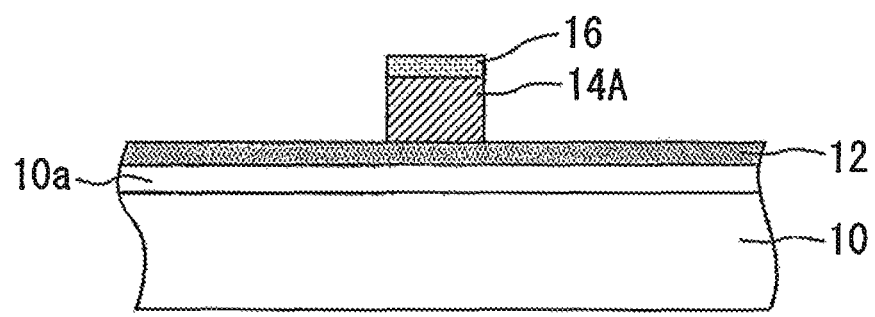
FIG. 3 is a cross-sectional view showing the remaining portion of the second layer.

The portions of the second layer 14 that are not covered by the mask 16 are then etched away. FIG. 3 is a cross-sectional view showing the remaining portion of the second layer 14. The remaining portion of the second layer 14 has the same width W1 as the mask 16 and is hereinafter referred to as the "second layer 14A." This etching may be, e.g., dry etching using fluorine radicals, although it may be any suitable dry etching or wet etching.

Figure 4:
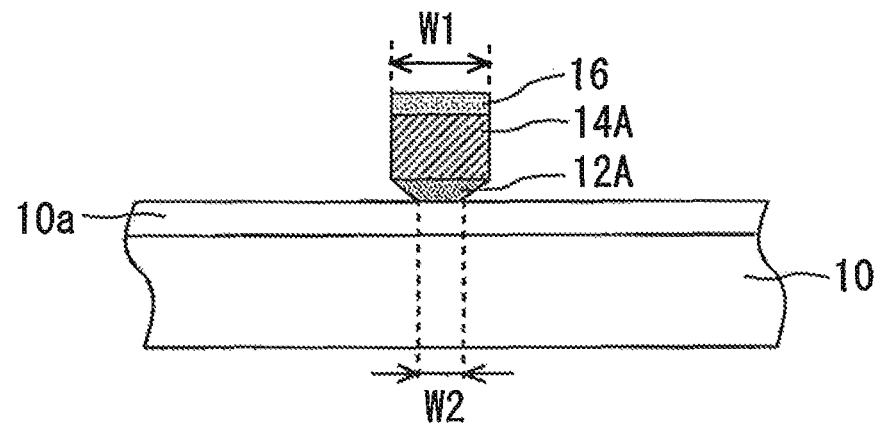
FIG. 4 is a cross-sectional view of the partially completed semiconductor device shown in FIG. 3 after the wet etching process has been completed.

The first layer 12 is then wet etched to a width which is less than the width of the mask 16. This process is referred to as a "wet etching process." FIG. 4 is a cross-sectional view of the partially completed semiconductor device shown in FIG. 3 after the wet etching process has been completed. In this wet etching process, the first layer 12 is etched in a chemical solution containing hydrofluoric acid.

In the wet etching process, the etch rate of the first layer 12 is higher than that of the second layer 14A, since the first layer 12 is formed of SiO and the second layer 14A is formed of SiN. That is, the first layer 12 is etched at a higher rate than the second layer 14A. This wet etching is continued until the first layer 12 has been substantially reduced in width, since the width of the remaining portion of the first layer 12 after this wet etching process determines and is equal to the width of the gate electrode subsequently formed. The remaining portion of the first layer 12 is hereinafter referred to as the "first layer 12A." The wet etching process is such that the width W2 of the first layer 12A is less than the width W1 of the mask 16.

Figure 5:
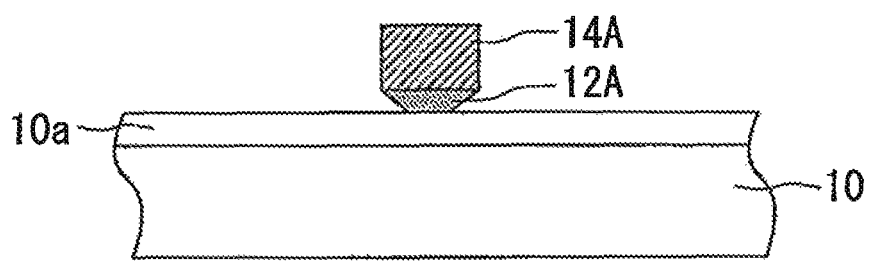
FIG. 5 is a cross-sectional view of the partially completed semiconductor device shown in FIG. 4 after the mask has been removed.
Figure 6:
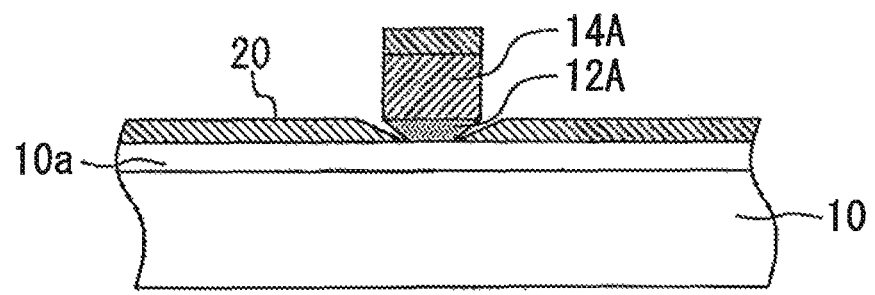
FIG. 6 is a cross-sectional view showing the insulating layer.

Next, the mask 16 is removed. FIG. 5 is a cross-sectional view of the partially completed semiconductor device shown in FIG. 4 after the mask has been removed. An insulating layer 20 is then formed on the top surface of the semiconductor layer 10a and the top surface of the second layer 14A. FIG. 6 is a cross-sectional view showing the insulating layer 20 after it has been formed. This insulating layer 20 is formed of, e.g., SiN.

Figure 7:
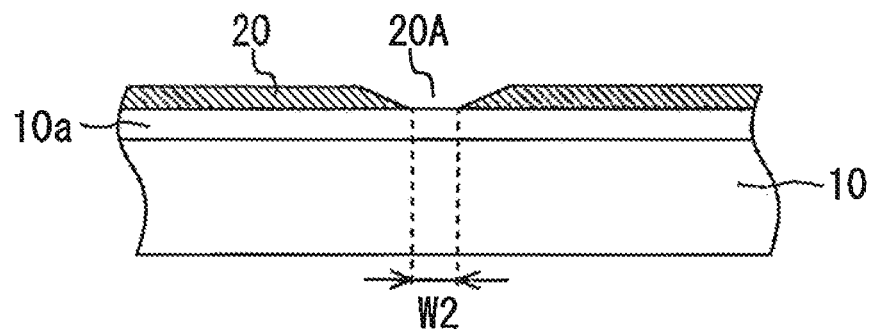
FIG. 7 is a cross-sectional view showing the opening formed in the insulating layer.

The first layer 12A and the second layer 14A are then removed, thereby forming an opening in the insulating layer 20. FIG. 7 is a cross-sectional view showing the opening formed in the insulating layer. Specifically, the first layer 12A and the second layer 14A are etched away by wet etching in a chemical solution containing hydrofluoric acid so that an opening 20A having a width W2 (equal to the width W2 of the first layer 12A) is formed in the insulating layer 20.

Figure 8:
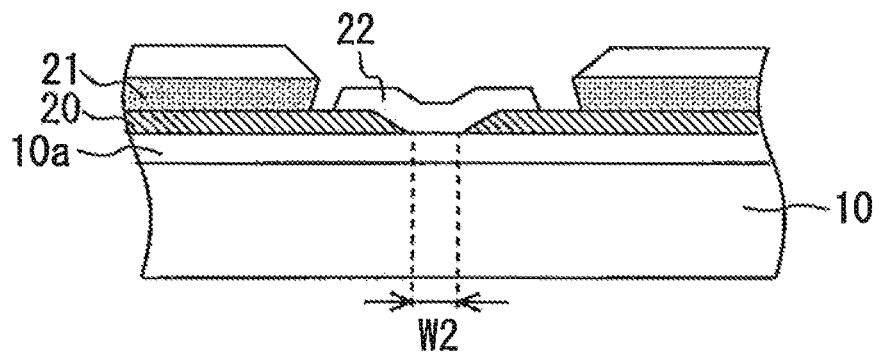
FIG. 8 is a cross-sectional view showing a resist pattern and electrode material.
Figure 9:
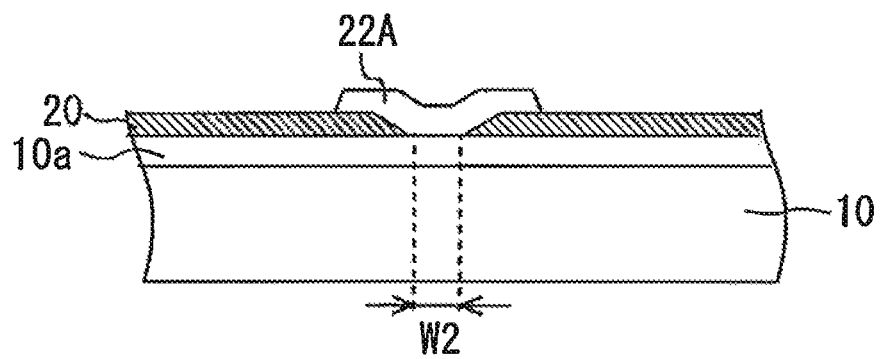
FIG. 9 is a cross-sectional view showing a gate electrode.

A gate electrode is then formed on the surface of the semiconductor layer 10a exposed through the opening 20A. Specifically, the gate electrode is formed by means of, e.g., a vapor deposition/lift-off technique. The method of forming the gate electrode by means of a vapor deposition/lift-off technique will be described with reference to FIGS. 8 and 9. First, as shown in FIG. 8, a resist pattern 21 is formed which has an opening for forming a gate electrode. An electrode material 22 is then deposited on the surface of the semiconductor layer 10a exposed through the opening, and on the insulating layer 20 and the resist pattern 21. After the deposition of the electrode material 22, the resist pattern 21 is removed, thereby forming a gate electrode 22A having a gate length W2, as shown in FIG. 9. It should be noted that the gate electrode 22A may be formed by other methods. For example, the insulating layer 20 may be removed as necessary.

Semiconductor devices such as HFETs and HEMTs of compound semiconductor are sometimes configured to have a reduced gate length to reduce the gate capacitance and thereby increase the maximum frequency at which they can operate. In that case, it is necessary to reduce the width of the gate electrode. However, if the opening for forming the gate electrode is formed by a "direct" forming process (in which a portion of an insulating layer formed on the semiconductor layer of the substrate is directly removed), then a high performance exposure apparatus is required to reduce the width of the gate electrode. Further, it has been found that dry etching used in the above process may damage the surface of the semiconductor layer.

In the semiconductor device manufacturing method of the first embodiment, on the other hand, the opening for forming the gate electrode is formed by an "indirect" forming process (in which first the first layer 12A is formed on the substrate at a position where the gate electrode is to be formed, then an insulating layer is formed on the first layer 12A and the exposed surface of the substrate, and then the first layer 12A is removed). In this method, the width of the gate electrode 22A is determined by the width of the first layer 12A. It should be noted that the width W2 of the first layer 12A can be reduced to the desired small value by the wet etching process described above by adjusting the wet etching conditions. This means that the width of the gate electrode 22A can be reduced to the desired small value by adjusting the width W2 of the first layer 12A.

Further, in the semiconductor device manufacturing method of the first embodiment, the layers in contact with the surface of the semiconductor layer 10a (namely, the first layer 12 and the insulating layer 20) are removed by wet etching, resulting in reduced damage to the surface of the semiconductor layer, as compared to when they are dry etched. Thus, the manufacturing method of the present embodiment is capable of reducing the width of the gate electrode while reducing damage to the surface of the semiconductor layer by using a simple method.

The following describes the purpose of the two layers of insulating film formed under the mask 16, namely the first layer 12 and the second layer 14 (or the first layer 12A and the second layer 14A). When the insulating layer 20 is formed on the substrate 10 and the second layer 14A, as shown in FIG. 6, if the portion of the insulating layer 20 on the substrate 10 connects with the portion on the second layer 14A, then the first layer 12A cannot be wet etched in the following wet etching step. To prevent this from happening, the combined thickness of the first layer 12 and the second layer 14 must be greater than a certain minimum thickness. Incidentally, in the wet etching process described with reference to FIG. 4, only the first layer 12 need be etched; it is not necessary to etch the second layer 14A. In the semiconductor device manufacturing method of the first embodiment, the second layer 14A is substantially not etched in the wet etching process and serves in effect as a mask. As a result, the first layer 12 can be effectively processed while avoiding unnecessary etching.

Although the semiconductor device manufacturing method of the first embodiment has been described in connection with the formation of the gate electrode 22A, it is to be understood that this manufacturing method may be applied to the manufacture of other types of electrodes. It should be noted that the manufacturing method of the subsequently described embodiment may also be applied not only to gate electrodes but also to other types of electrodes.

Further, although in the present embodiment two layers, namely the first layer 12 and the second layer 14, are formed on the semiconductor layer 10a, it is to be understood that in other embodiments a composite lamination consisting of three or more layers may be formed on the substrate (or the semiconductor layer 10a). In that case, the layer of the composite lamination which is in contact with the substrate must have a higher etch rate than the other layers in the wet etching process.

Second Embodiment

Figure 10:
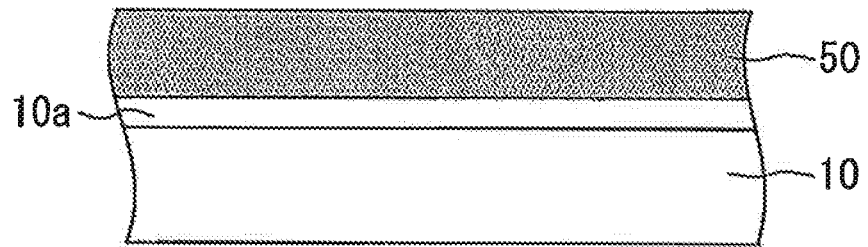
FIG. 10 is a cross-sectional view showing the Si oxide.

A method of manufacturing a semiconductor device in accordance with a second embodiment of the present invention will be described with reference to the accompanying drawings. The method begins by forming a Si oxide 50 on a semiconductor layer 10a. FIG. 10 is a cross-sectional view showing the Si oxide 50 after it has been formed. Specifically, this Si oxide 50 is SiO.

Figure 11:
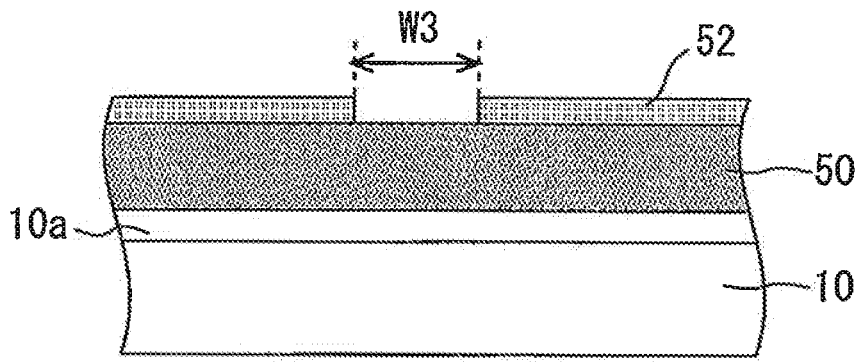
FIG. 11 is a cross-sectional view showing the patterned mask.

Next, a patterned mask 52 is formed on the Si oxide 50. FIG. 11 is a cross-sectional view showing the patterned mask 52 after it has been formed. This mask 52 has an opening having a width W3.

Figure 12:
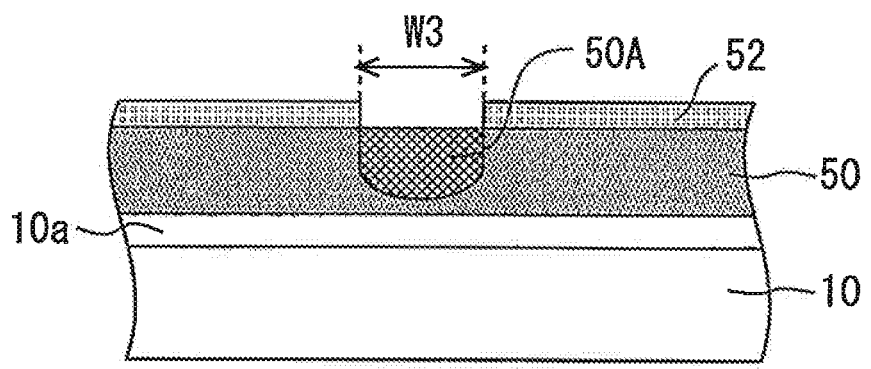
FIG. 12 is a cross-sectional view showing the Si oxide after it has been subjected to the ashing treatment.

Ashing treatment is then applied to the Si oxide 50. FIG. 12 is a cross-sectional view showing the Si oxide 50 after it has been subjected to the ashing treatment. Specifically, in this step, ashing treatment is applied to the portion of the Si oxide 50 exposed through the opening of the mask 52. Ashing treatment is a treatment in which an object to be treated is oxidized, or ashed. As a result of the ashing treatment, an oxygen-rich portion 50A is formed in the Si oxide 50. The oxygen-rich portion 50A extends short of the bottom of the Si oxide 50; that is, the bottom portion of the Si oxide 50 is not oxidized, or ashed, and remains intact.

Figure 13:
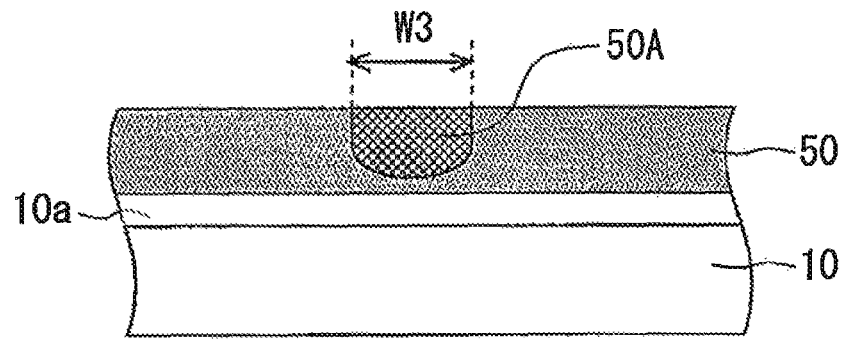
FIG. 13 is a cross-sectional view of the partially completed semiconductor device shown in FIG. 12 after the mask has been removed.
Figure 14:
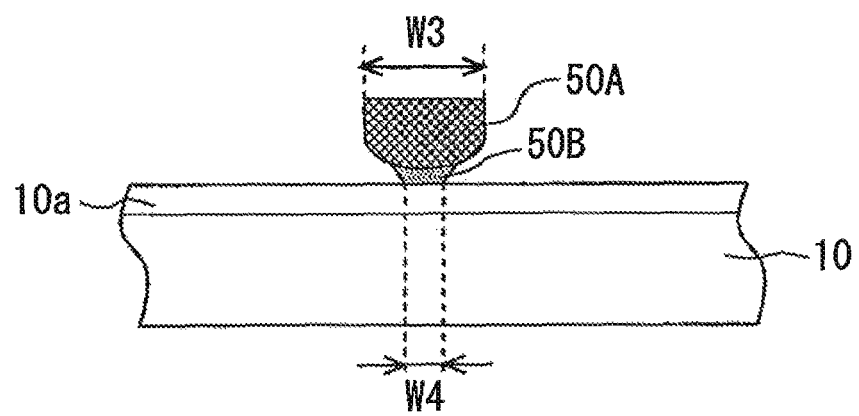
FIG. 14 is a cross-sectional view of the partially completed semiconductor device shown in FIG. 13 after it has been subjected to the wet etching process.

Next, the mask 52 is removed. FIG. 13 is a cross-sectional view of the partially completed semiconductor device shown in FIG. 12 after the mask has been removed. A wet etching process is then performed. FIG. 14 is a cross-sectional view of the partially completed semiconductor device shown in FIG. 13 after it has been subjected to the wet etching process. This wet etching process uses a chemical solution containing hydrofluoric acid. In this wet etching process, the Si oxide 50 tends to have a higher etch rate than the oxygen-rich portion 50A, since the Si oxide 50 is SiO. Utilizing this fact, the wet etching process is performed in such a manner that the Si oxide 50 is etched without substantially etching the oxygen-rich portion 50A. The process is continued until the remaining portion of the Si oxide 50 under the oxygen-rich portion 50A has been reduced in width to a width W4 smaller than the width W3 of the oxygen-rich portion 50A. The remaining portion of the Si oxide 50 is hereinafter referred to as the "Si oxide 50B."

Figure 15:
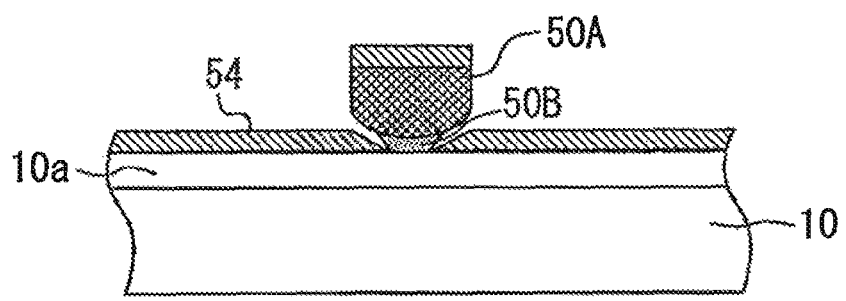
FIG. 15 is a cross-sectional view showing the insulating layer.
Figure 16:
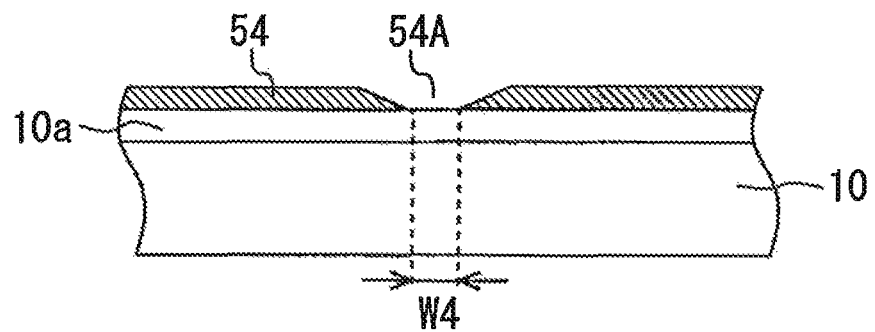
FIG. 16 is a cross-sectional view of the partially completed semiconductor device shown in FIG. 15 after the Si oxide and the oxygen-rich portion have been removed.

Next, an insulating layer 54 is formed on the semiconductor layer 10a. FIG. 15 is a cross-sectional view showing the insulating layer 54 after it has been formed. This insulating layer 54 is formed of, e.g., SiN. The Si oxide 50B and the oxygen-rich portion 50A are then removed by wet etching in a chemical solution containing hydrofluoric acid. FIG. 16 is a cross-sectional view of the partially completed semiconductor device shown in FIG. 15 after the Si oxide and the oxygen-rich portion have been removed. As a result of this step, an opening 54A having a width W4 (equal to the width W4 of the Si oxide 50B) is formed in the insulating layer 54.

Figure 17:
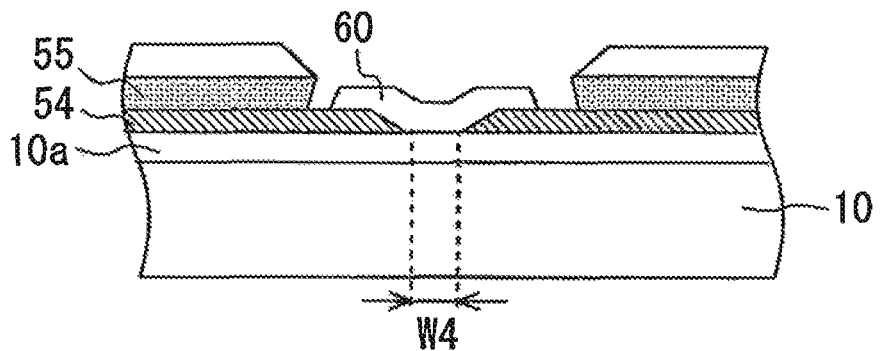
FIG. 17 is a cross-sectional view showing a resist pattern and electrode material.
Figure 18:
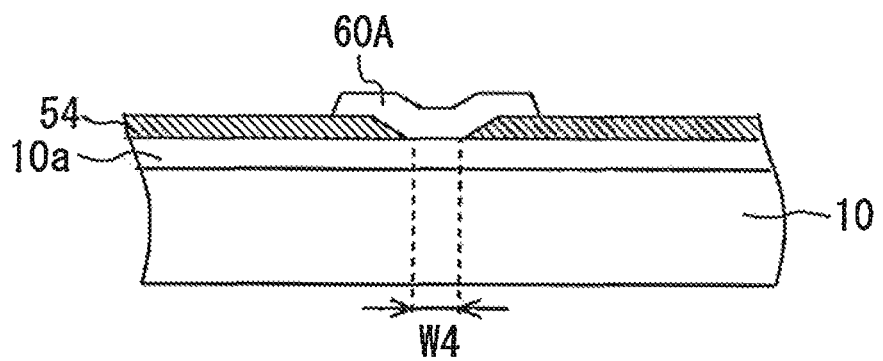
FIG. 18 is a cross-sectional view showing a gate electrode.

A gate electrode is then formed on the surface of the semiconductor layer 10a exposed through the opening 54A. Specifically, the gate electrode is formed by means of, e.g., a vapor deposition/lift-off technique. The method of forming the gate electrode by means of a vapor deposition/lift-off technique will be described with reference to FIGS. 17 and 18. First, as shown in FIG. 17, a resist pattern 55 is formed which has an opening for forming a gate electrode. An electrode material 60 is then deposited on the surface of the semiconductor layer 10a exposed through the opening, and on the insulating layer 54 and the resist pattern 55. After the deposition of the electrode material 60, the resist pattern 55 is removed, thereby forming a gate electrode 60A having a gate length W4, as shown in FIG. 18. It should be noted that the gate electrode 60A may be formed by other methods. For example, the insulating layer 54 may be removed as necessary.

In the semiconductor device manufacturing method of the second embodiment, the Si oxide 50 formed on the semiconductor layer 10a is etched using a wet etching process, thereby producing the Si oxide 50B having a smaller width than the oxygen-rich portion 50A. This wet etching process may be adjusted so that the Si oxide 50B has a very small width. This results in reduced width of the gate electrode, since the width of the gate electrode is determined by the width of the Si oxide 50B.

Further, in this method, the layers formed in contact with the surface of the semiconductor layer 10a (namely, the Si oxide 50 and the insulating layer 54) are wet etched, resulting reduced damage to the surface of the semiconductor layer 10a, as compared to when they are dry etched. Further, the semiconductor device manufacturing method of the second embodiment is advantageous over that of the first embodiment in that there is no need to form more than one layer on the semiconductor layer 10a.

Although in the semiconductor device manufacturing method of the second embodiment the Si oxide 50 is SiO, it is to be understood that it may be any material that can be used to form an oxygen-rich portion by means of ashing and that can be removed by wet etching.

Thus the present invention provides a method of manufacturing a semiconductor device, in which the insulating layer pattern for forming an electrode is formed by wet etching, making it possible to reduce the width of the electrode while reducing damage to the surface of the semiconductor layer by using a simple method.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-249414, filed on Nov. 13, 2012, including specification, claims, drawings, and summary, on which the Convention priority of the present application is based, is incorporated herein by reference in its entirety.

What is claimed is:

1. A method of manufacturing a semiconductor device, comprising:
    forming a first layer of SiO on a semiconductor layer;
    forming a second layer of SiN on said first layer;
    forming a patterned mask on said second layer, wherein said patterned mask has a width and covers a portion of said second layer;

etching and removing the portion of said second layer that is not covered by said patterned mask;

wet etching said first layer, using a solution containing hydrofluoric acid, to a width which is less than the width of said patterned mask;

after said wet etching, forming an insulating layer on said semiconductor layer;

removing said first layer and said second layer to form an opening in said insulating layer; and forming a gate electrode on a surface of said semiconductor layer exposed through the opening, wherein in said wet etching, etching said first layer is faster than etching said second layer.

2. A method of manufacturing a semiconductor device, comprising:

forming a Si oxide layer on a semiconductor layer;

forming a patterned mask on said Si oxide layer;

ashing a portion of said Si oxide layer exposed by said patterned mask to form an oxygen-rich portion in said Si oxide layer so that a bottom portion of said Si oxide layer is not oxidized, wherein said oxygen-rich portion has a width;

after forming said oxygen-rich portion, removing said patterned mask;

wet etching and removing a portion of said Si oxide layer without etching said oxygen-rich portion until a remaining portion of said Si oxide layer under said oxygen-rich portion has been reduced in width to a width smaller than the width of said oxygen-rich portion;

after said wet etching, forming an insulating layer on said semiconductor layer;

removing said Si oxide layer and said oxygen-rich portion to form an opening in said insulating layer; and forming a gate electrode on said semiconductor layer exposed through the opening.

3. The method according to claim 2, wherein:

said Si oxide is SiO; and a solution containing hydrofluoric acid is used in said wet etching.

4. A method of manufacturing a semiconductor device, comprising:

forming a first layer on a semiconductor layer;

forming a second layer on said first layer;

forming a patterned mask on said second layer, wherein said patterned mask has a width and covers a portion of said second layer, wherein forming said patterned mask on said second layer comprises forming said patterned mask of one of a metal and a photoresist on said second layer;

etching and removing the portion of said second layer that is not covered by said patterned mask;

wet etching said first layer to a width which is less than the width of said patterned mask;

after said wet etching, forming an insulating layer on said semiconductor layer;

removing said first layer and said second layer to form an opening in said insulating layer; and forming a gate electrode on a surface of said semiconductor layer exposed through the opening, wherein in said wet etching, etching said first layer is faster than etching said second layer.

5. The method according to claim 4, wherein:

said first layer is SiO;

said second layer is SiN; and a solution containing hydrofluoric acid is used as an etchant in said wet etching.

* * * * *